United States Patent [19]

Berndes et al.

[11] 3,964,091
[45] June 15, 1976

[54] TWO-WAY SEMICONDUCTOR SWITCH

[75] Inventors: Günter Berndes, Heppenheim; Horst Krassin, Hemsbach, both of Germany

[73] Assignee: BBC Brown Boveri & Company Limited, Baden, Switzerland

[22] Filed: Oct. 11, 1974

[21] Appl. No.: 514,101

[30] Foreign Application Priority Data
  Oct. 16, 1973  Germany............................ 2351783

[52] U.S. Cl.................................. 357/39; 357/38; 357/86
[51] Int. Cl.² ...................................... H01L 29/747
[58] Field of Search........................... 357/38, 39, 86

[56] References Cited
UNITED STATES PATENTS

| | | | |
|---|---|---|---|
| 3,360,696 | 12/1967 | Neilson et al. | 357/39 |
| 3,475,666 | 10/1969 | Hutson | 357/39 |
| 3,731,162 | 5/1973 | Suenaga et al. | 357/39 |
| 3,858,236 | 12/1974 | Schafer et al. | 357/38 |

*Primary Examiner*—Andrew J. James
*Assistant Examiner*—Joseph E. Clawson, Jr.
*Attorney, Agent, or Firm*—Pierce, Scheffler & Parker

[57] ABSTRACT

A two-way semiconductor switch, commonly known as a Triac comprises a semiconductor body having at least five superposed zones alternating in conductivity types, the three inner zones forming the basic interior structure and the outer zones, each of different conductivity types, located at the opposite end faces of the semiconductor body forming the emitter or anode boundary zones respectively, and having a main electrode in ohmic contact therewith. One end face also includes first and second control zones of different conductivity types spaced laterally from the outer zones of different conductivity types at that end and in ohmic contact with a control electrode common to both control zones. The penetration depth of the second control zone and/or the penetration depth of the outer zone at the opposite end face of the semiconductor body structure having the same type of conductivity as the second control zone are made greater than the penetration depth of the outer zone of the same type of conductivity at the end face at which the second control zone is located, and a greater emitter short-circuit density is provided at the main electrode in contact with the opposite end face than at the other main electrode, in order to maintain commutation stability.

1 Claim, 1 Drawing Figure

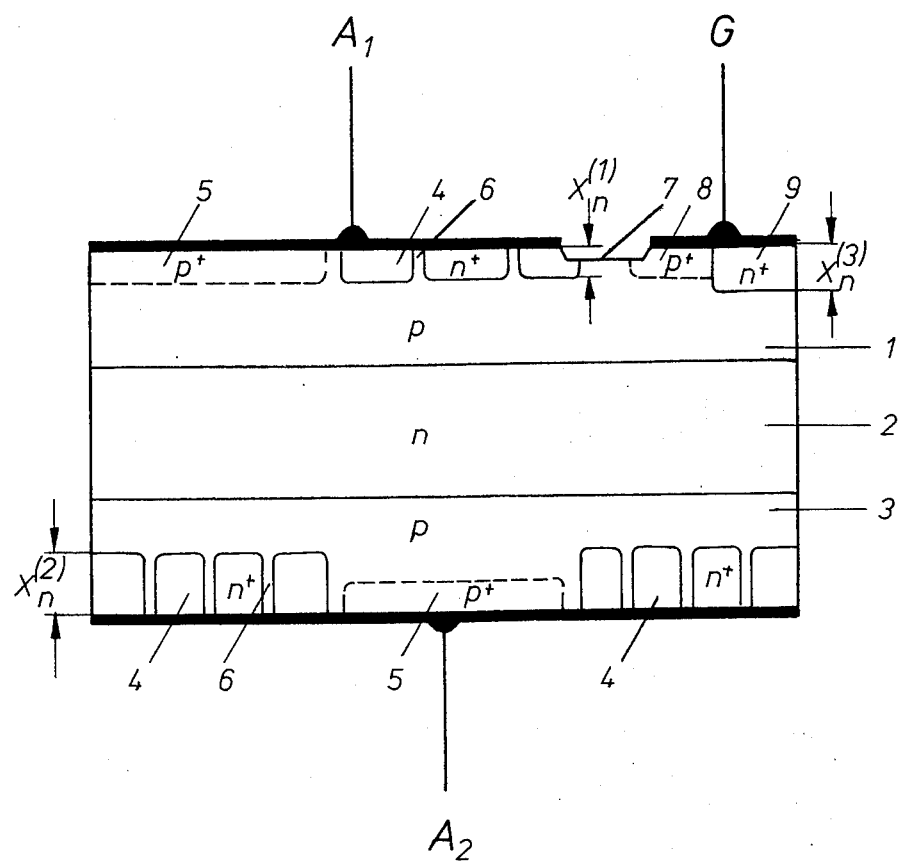

TWO-WAY SEMICONDUCTOR SWITCH

The present invention relates to an improvement in the construction of a two-way semiconductor switch, commonly known as a Triac, the body of the semiconductor comprising at least five zones alternating in types of conductivity, the three inner zones forming the basic interior structure of the semiconductor body, and the outer zones each of different conductivity types located at the opposite end faces of the semiconductor body, forming the emitter or anode boundary zones, respectively, wherein main electrodes are provided in ohmic contact respectively with the opposite end faces of the semiconductor body, and wherein at one end face of the semiconductor body — and spaced laterally from the outer zones of different conductivity type — first and second control zones of different conductivity type are formed and are in ohmic contact with a control electrode common to both control zones.

The Triac serves as a two-way load control, its principle of operation being explained, for example, in the published German Patent Application DT-OS No. 1,489,894, and also in the Proceedings of the IEEE, April, 1965, Pages 355–369.

It is desirable to utilize a Triac in four modes of operation, i.e. in a four-quadrant operation; in other words, the first main electrode is negative, or positive, relative to the second main electrode, located respectively at opposite faces of the multi-zoned semiconductor body, and the control electrode is, in each case, either positive or negative relative to the first main electrode. It is imperative to make certain that the Triac will require substantially the same ignition - or control current respectively for all four modes of operation.

Triac structures of the above-mentioned type and possessing a satisfactory symmetry of ignition currents are already known, reference being made, for example, to German Patent Specifications DT-AS No. 1,764,821; DT-AS No. 1,539,982; DT-OS No. 2,261,819 and U.S. Pat. No. 3,549,961.

In order to balance and lower the height of the ignition current, there is used, in the case of Triacs of known construction, a certain lateral geometry. It is known, in this connection, for forming shunts between adjacent zones within the semiconductor structure, to etch a groove, or gate between the zones associated with one of the main electrodes and the zones associated with the control electrode, and to establish current paths of equal length, for example, by annularly-shaped geometry and lateral offsetting of the outer zones involved, so that the intensity of the control current, required for ignition, will have at least the same order of magnitude for all four modes of operation. In this connection, see the above-mentioned German published patent specification DT-OS No. 2,261,819.

In the case of Triacs of known constructions, there also exists a close relationship as between ignition response and commutation response, i.e. an improvement in the ignition response will generally lead to a deterioration of the maximum-allowable voltage slope ($du/dt$ stability after the commutation). It is a known fact that in the case of an inductive load being switched by the Triac, the voltage will lead the load current. Upon crossover of the load current through the zero point, the voltage will leap to the value corresponding to a sine function. The rate of the rise in voltage is limited only by the capacity of the Triac and the inductive load. It is known to limit this voltage rise by adding a resistor and condenser in series combination in parallel to the Triac, as described in the SCR General Electric Manual, 4th Edition, 1967, section 7.1.4.

The objective of the present invention is to provide an improved structure for a Triac of the general type above discussed which results in an improved symmetry of the ignition currents, and which also renders the commutation responses independent of one another.

This objective is attained in that the penetration depth $x_n^{(3)}$ (as shown on the accompanying drawing) of the second control zone at one end face of the semiconductor structure and/or the penetration depth $x_n^{(2)}$ of the outer zone at the opposite end face of the semiconductor structure having the same type of conductivity as the second control zone, are greater than the penetration depth $x_n^{(1)}$ of the outer zone of the same type of conductivity at the end face at which the second control zone is located, the depths of penetration $x_n^{(i)}$ in each case being in reference to the main sides of the three-zonal basic structure, and there being provided at the main electrode in contact with the opposite end face a greater emitter short-circuit density than at the other main electrode, in order to maintain commutation stability.

The ignition current is reduced in an advantageous manner to a greater or lesser extent in the various ignition quadrants, by the increase in penetration depth $x_n^{(3)}$ of the second control zone and/or the penetration depth $x_n^{(2)}$ at the main electrode in contact with the said opposite end face of the semiconductor structure according to the following table

| Ignition Quadrant Polarity | I $A_2>A_1$ $G>A_1$ | II $A_2>A_1$ $G<A_1$ | III $A_2<A_1$ $G<A_1$ | IV $A_2<A_1$ $G>A_1$ |
|---|---|---|---|---|
| $x_n^{(3)} > x_n^{(1)} = x_n^{(2)}$ | — | greatly | slightly | slightly |
| $x_n^{(2)} > x_n^{(1)} = x_n^{(3)}$ | — | — | greatly | greatly |
| $x_n^{(2)}, x_n^{(3)} > x_n^{(1)}$ | — | greatly | greatly | greatly |

In the above table:

$A_1$ denotes the main electrode at the end face of the semiconductor body structure at which the control zones are located.

$A_2$ denotes the main electrode at the opposite end face of the semiconductor body structure.

G denotes the control electrode, and $x_n^{(i)}$ denotes the above-mentioned penetration depths.

The table shows pertinent reduction in the height of the ignition current of a Triac structure in accordance with the present invention as compared with a Triac having only a laterally modified geometry. There are furthermore attained advantageously substantially equal levels of ignition current for all four ignition quadrants.

The influence of the penetration depth $x_n^{(3)}$ on the commutation stability can be disregarded. However, an increase in $x_n^{(2)}$ has a lowering affect on the $du/dt$ stability during commutation from the polarity $A_1 < A_2$ to $A_1 > A_2$. Such reduction is compensated for in an advantageous manner by a greater emitter short-circuit density at the main electrode $A_2$, a step which will not have any significant affect on the ignition currents.

The non-related and variant depths of penetration of the zones mentioned can be attained, for example, by a diffusion, varying in depth, of the areas $x_n^{(i)}$ after previous marking, or by a progressive etching of the three-zonal basic semiconductor structure, followed by formation of the zones by diffusion. The penetration depths $x_n^{(i)}$ are therefore always relative to the mathematical original surface of the basic structure, e.g. p-n-p.

The invention will now be more clearly understandable by reference to the accompanying drawing which illustrates the improved Triac semiconductor structure in a somewhat diagrammatic transverse section, and being greatly exaggerated in scale, especially as regards thickness in order to show the various zones more clearly. This sectional view shows the build-up of the various zones only in a diagrammatic fashion, first because a single cross-section through the semiconductor body would not include all zones, and secondly because the significant features of the invention are more easily demonstrable by the diagrammatic presentation.

With reference now to the drawing, it will be seen that the basic structure of the semiconductor body consists of three zones 1, 2 and 3 having opposite types of conductivity in alternation, e.g. a p-n-p type of structure. At each end face of the semiconductor body, outer zones 4 and 5 of opposite types of conductivity are formed and which serve respectively as emitter and anode boundary emitter zones. In the illustrated structure, the zones 4 are doped $n^+$ and the anode zones 5 are doped $p^+$. Between these zones areas 6 rise to the surface and form shunts for the adjacent basic zones 1 and 3. A main electrode $A_1$ lies in ohmic contact with a portion of the upper end face of the semiconductor body structure as viewed in the drawing, and a control electrode G at this same end face is separated by a groove, i.e. gate 7, from the remainder of the end face area that is contacted by the main electrode $A_1$. Underneath the control electrode G and in ohmic contact therewith is a first control zone 8, i.e. a highly doped area having a $p^+$-type conductivity of the adjacent basic zone 1 of p-type conductivity, and a second control zone 9 of the opposite type of conductivity, i.e. an $n^+$-type. Two arrows indicate, in each case the zones $x_n^{(1)}$, $x_n^{(2)}$ and $x_n^{(3)}$, their respective penetration depths of which relative to each other are established in accordance with the invention and defined in the appended claims.

An increase in the penetration depth $x_n^{(3)}$ of control zone 9 and/or the penetration depth $x_n^{(2)}$ of outer zone 4 will cause a lowering of the ignition current in the various ignition quadrants due to the thereby increased current amplification factors of the basic three-layer semiconductor structure which control the various ignition conditions. A satisfactory $du/dt$ stability, even in the event of a greater penetration depth $x_n^{(2)}$, is attained by an increase in the emitter short-circuit density within the region of the main electrode $A_2$ in ohmic contact with the end face of the semiconductor body structure. That is to say an increase in the density of pin-point penetrations of inner zone 3 into the surface of the outer zone in contact with the main electrode $A_2$ which means a greater number of "shorting" connections between zone 3 and the main electrode $A_2$. The use of shorted emitters is known per se in view of the above-discussed German Patent Specification DT-AS No. 1,539,982 as well as in the referred-to SCR manual, and especially Page 10 thereof.

We claim:

1. In a two-way semiconductor switch comprising a semiconductor body structure having at least five superposed zones alternating in conductivity types, the three inner zones forming the basic interior structure, and the two outer zones each of which includes subzones of different conductivity types located at the opposite end faces of the semiconductor body forming the emitter and anode boundary zones respectively and one of an n-p-n-p-structure and a p-n-p-n-structure together with the three inner zones, the outer zones having a main electrode in ohmic contact therewith and one end face of said semiconductor body including means providing first and second control zones of different conductivity types and in ohmic contact with a control electrode common to both control zones, the improvement wherein the penetration depth of said second control zone and the penetration depth of the part of the outer zone at the opposite end of said semiconductor body structure having the same type of conductivity as said second control zone are made greater than the penetration depth of the part of the outer zone of the same type of conductivity at the end face at which said second control zone is located, and a greater emitter short-circuit density is provided at the main electrode in contact with said opposite end face than at the other main electrode, thereby to maintain commutation stability.

* * * * *